(12) United States Patent
Kawabata et al.

(10) Patent No.: US 8,742,589 B2
(45) Date of Patent: Jun. 3, 2014

(54) SEMICONDUCTOR EMBEDDED MODULE AND METHOD FOR PRODUCING THE SAME

(75) Inventors: Kenichi Kawabata, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 534 days.

(21) Appl. No.: 12/458,636

(22) Filed: Jul. 17, 2009

(65) Prior Publication Data

US 2010/0013103 A1   Jan. 21, 2010

(30) Foreign Application Priority Data

Jul. 18, 2008   (JP) ................................. 2008-186864

(51) Int. Cl.
  *H01L 23/48*   (2006.01)
(52) U.S. Cl.
  USPC ............. 257/774; 257/702; 528/99; 438/629; 438/125
(58) Field of Classification Search
  CPC .............................................. H01L 2924/0665
  USPC .................. 438/127, 687; 257/774, E31.117, 257/E33.059, E51.02, E33.058; 361/761; 349/158; 427/380; 528/99
  See application file for complete search history.

(56) References Cited

U.S. PATENT DOCUMENTS

| | | | |
|---|---|---|---|
| 5,641,852 A * | 6/1997 | Tsuji et al. ...................... 528/99 |
| 6,159,547 A * | 12/2000 | McMordie et al. ........... 427/380 |
| 7,012,490 B2 | 3/2006 | Aoki et al. | |
| 7,078,265 B2 | 7/2006 | Terui et al. | |
| 7,486,373 B2 * | 2/2009 | Lee et al. ...................... 349/158 |
| 2001/0010627 A1 * | 8/2001 | Akagawa ...................... 361/761 |
| 2002/0048951 A1 * | 4/2002 | Jeong et al. ................... 438/687 |
| 2004/0180475 A1 * | 9/2004 | Shibata et al. ................ 438/127 |
| 2007/0052095 A1 | 3/2007 | Torii et al. | |

FOREIGN PATENT DOCUMENTS

| | | |
|---|---|---|
| JP | A-2000-183239 | 6/2000 |
| JP | A-2004-31813 | 1/2004 |
| JP | A-2004-72032 | 3/2004 |
| JP | A-2004-79816 | 3/2004 |
| JP | A-2004-172542 | 6/2004 |
| JP | A-2004-179482 | 6/2004 |
| JP | A-2004-273591 | 9/2004 |
| JP | A-2006-120943 | 5/2006 |
| JP | A-2007-5832 | 1/2007 |
| JP | A-2007-73681 | 3/2007 |
| JP | A-2007-287901 | 11/2007 |

* cited by examiner

*Primary Examiner* — Eugene Lee
*Assistant Examiner* — Fang-Xing Jiang
(74) *Attorney, Agent, or Firm* — Oliff PLC

(57) ABSTRACT

A semiconductor embedded module 1 of the present invention has a configuration in which a semiconductor device 20, which is an electronic component such as a semiconductor IC (die) in a bare chip state, is embedded in a resin layer 10 (second insulating layer). In the semiconductor device 20, a redistribution layer 22 is connected to land electrodes. A protective layer 24 (first insulating layer) is provided on the redistribution layer 22, and is provided with openings such that external connection pads P of the redistribution layer 22 are exposed. Also, the resin layer 10 is formed to cover the protective layer 24, and vias V are formed at the positions of the respective external connection pads P of the redistribution layer 22. The grinding rate of the resin layer 10 is larger than that of the protective layer 24.

7 Claims, 3 Drawing Sheets

SEMICONDUCTOR EMBEDDED MODULE AND METHOD FOR PRODUCING THE SAME

CROSS-REFERENCES TO RELATED APPLICATIONS

The present application is based on Japanese priority application No. 2008-186864, filed on Jul. 18, 2008, the entire contents of which are hereby incorporated by reference.

BACKGROUND

1. Technical Field

The present invention relates to a semiconductor embedded module and a method for producing the same.

2. Related Art

Generally, a substrate which is provided with an electronic component (electronic component-embedded substrate) such as a semiconductor device (an IC chip or other type of semiconductor active element) has a structure in which a semiconductor device (die) in a bare chip state is fixed to a substrate constituted by a single resin layer or plural resin layers. In order to respond to the demand for higher performance and downsizing of electronic equipment, modules are now being provided with higher-density packaging of active components such as semiconductor devices and passive components such as resistors and capacitors.

In recent years, there has been a stronger demand than ever before for portable equipment typified by portable terminals such as mobile telephones to be provided in higher-density packaging. More recently, the demand, in particular, for a reduction in thickness and narrowing of portable equipment has been increasing. In response, there has been a strong demand for a higher density, a reduction in thickness, and a decrease in pitch in semiconductor embedded modules used in the above portable equipment, etc., and also, a further reduction in thickness of the electronic components themselves has been proceeding rapidly. As an example of such semiconductor embedded modules, a module in which a CSP (chip size package) including an IC chip has been subjected to redistribution (rewiring) and is embedded in a resin substrate is proposed in JP2004-072032 A.

SUMMARY

In order to draw wiring onto a substrate from an IC chip or CSP which is embedded in the substrate to form a module, a via needs to be formed on a wiring layer (redistribution layer, rewiring layer) of the IC chip. However, as described above, with downsizing and a reduction in pitch of a device or component, alignment between an external connection pad of the IC chip and a via has been becoming difficult to be performed with high precision. If the via is opened at the position where the via is dislocated from the external connection pad of the IC chip, the circuit of the IC chip or distribution layer of the CSP may be damaged when the circuit or redistribution layer is at the opening position.

The present invention has been made in light of the above circumstances, and therefore has an object to provide a semiconductor embedded module which, when forming a via for external connection for a semiconductor device, can prevent a circuit or wiring of the semiconductor device from being damaged, and to provide a method for producing the same.

In order to attain the above object, the semiconductor embedded module of the invention is provided with: a semiconductor device which is provided with or connected with a wiring layer; a first insulating layer which is provided in the periphery of the wiring layer such that an external connection pad of the wiring layer is exposed; and a second insulating layer which is provided on the first insulating layer and which has a grinding rate larger than that of the first insulating layer.

In the semiconductor embedded module with the above structure, when grinding the second insulating layer in order to form a via on the external connection pad for external connection of the semiconductor device, even if the via formation position is dislocated from the target position, the semiconductor device is protected by the first insulating layer because the grinding rate of the second insulating layer is larger than that of the fist insulating layer; in other words, the first insulating layer is more difficult to be ground than the second insulating layer. Accordingly, the circuit and internal wiring of the semiconductor device are not damaged due to grinding.

As described above, even if the via opening position is slightly dislocated from the position of the external connection pad, in other words, the via is opened on at least a part of the external connection pad and at least a part of the first insulating layer, wiring can be reliably drawn to the outside without damaging the semiconductor device.

More specifically, it is preferable that the first insulating layer is formed of imide resin or a resin composition containing imide resin and that the second insulating layer is formed of epoxy resin or a resin composition containing epoxy resin, since both the layers are significantly different in terms of grinding rates.

Further, the method for producing a semiconductor embedded module according to the invention is a method for effectively producing the semiconductor embedded module of the invention, and the method includes the steps of: preparing a semiconductor device which is provided with a wiring layer; providing a first insulating layer in the periphery of the wiring layer such that an external connection pad of the wiring layer is exposed; providing, on the first insulating layer, a second insulating layer having a grinding rate larger than that of the first insulating layer; and grinding a part of the second insulating layer which is on the external connection pad to form a via to have the external connection pad exposed. Here, the step of providing a mask which is provided with an opening corresponding to a portion of the second insulating layer which is above the external connection pad may further be implemented, and in the step of having the external connection pad exposed, the second insulating layer may be ground through blasting treatment to form a via.

Moreover, employing wet blasting for blasting treatment is useful because, in comparison with dry blasting, wet blasting easily prevents electrification.

According to the invention, since the grinding rate of the second insulating layer provided on the first insulating layer provided in the periphery of the semiconductor device is larger than the grinding rate of the first insulating layer, when grinding the second insulating layer in order to form the via on the external connection pad for the semiconductor device, even if the via formation position is dislocated from the target position, the semiconductor device is protected by the first insulating layer. Accordingly, the circuit and internal wiring of the semiconductor device can be reliably prevented from being damaged due to grinding.

DESCRIPTION OF EXEMPLARY EMBODIMENTS

Figure 1:
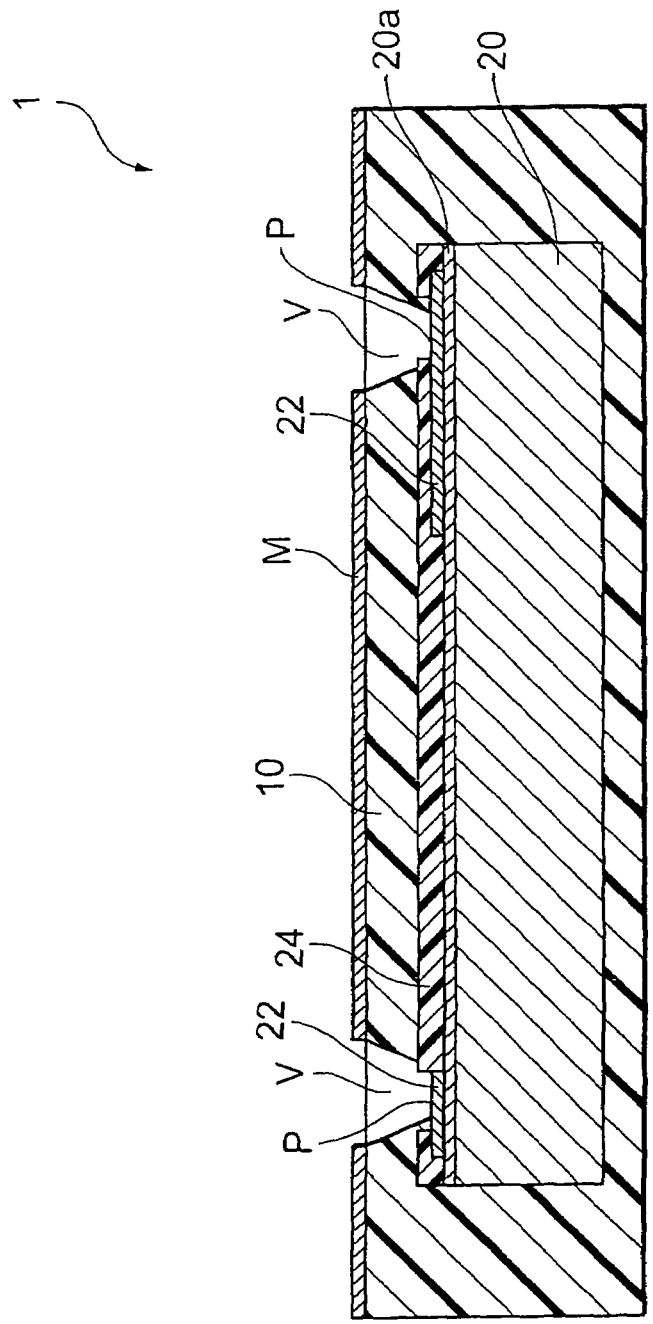
FIG. 1 is a sectional view showing a schematic configuration of an embodiment of a semiconductor embedded module according to the invention.

An embodiment of the invention will hereinafter be described in detail. Note that like components are denoted by like reference symbols and will not be further explained. It is assumed that vertical and horizontal positional relations are based on the positional relations shown in the drawings, unless otherwise specified. Also, the dimensional ratios of the drawings are not limited to a shown ratio. Moreover, the following embodiment is for explaining the invention, and is not intended to limit the invention to the embodiment only. Furthermore, various modifications of the invention may be made without departing from the gist of the invention.

FIG. 1 is a sectional view showing a schematic configuration of an embodiment of a semiconductor embedded module according to the invention. A semiconductor embedded module 1 has a configuration in which a semiconductor device 20, which is an electronic component such as a semiconductor IC (die) in a bare chip state, is embedded in a resin layer 10 (second insulating layer).

The semiconductor device 20 has a configuration in which: a main surface 20a having a substantially rectangular plate shape is provided with a large number of land electrodes (not shown); and a redistribution layer 22 (wiring layer) is connected with these land electrodes. A protective layer 24 (first insulating layer) is provided on the redistribution layer 22, and is provided with openings such that external connection pads P of the redistribution layer 22 are exposed. Also, the resin layer 10 is formed to cover the protective layer 24, and vias V are formed at the positions of the respective external connection pads P of the redistribution layer 22.

An example of the procedure for producing the semiconductor embedded module 1 having the above-described structure is as shown below. First, the semiconductor device 20 with which the redistribution layer 22 is connected is prepared, and the protective layer 24 is deposited on the main surface 20a. Regarding the protective layer 24, a layer whose grinding rate obtained after hardening is smaller than that of the resin layer 10 may be appropriately selected to be used, and the kind is not particularly limited. Examples of the protective layer 24 include organic insulating materials such as imide resin (imide group: group having R—CONHCO—R'), benzocyclobutene (BCB) resin, and fluorinated resin (including relevant modified resin). In addition, inorganic insulating materials such as tantalum nitride and silicon nitride may also be used.

Next, a part of the protective layer 24 which corresponds to each of the external connection pads P of the redistribution layer 22 is opened. The resultant opening may be formed by removing the relevant opening part of the deposited protective layer 24; alternatively, the opening may be formed by forming the protective layer 24 with the opening part being masked and then removing the mask. The semiconductor device 20 having the protective layer 24 formed with the opening is embedded in the resin layer 10. Regarding the resin layer 10, a resin layer whose grinding rate obtained after hardening is larger than that of the protective layer 24 may be appropriately selected to be used, and the kind is not particularly limited. Examples of the resin layer 10 include: a single element of thermosetting resin such as epoxy resin (thermosetting resin harder than epoxy resin); a material obtained by adding silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like to one of the above resins; a material obtained by adding metal oxide powder containing at least one metal selected from the group consisting of magnesium, silicon, titanium, zinc, calcium, strontium, zirconium, tin, neodymium, samarium, aluminum, bismuth, lead, lanthanum, lithium, and tantalum to one of the above resins; a material obtained by blending, e.g., resin fiber such as glass fiber or aramid fiber to one of the above resins; a material obtained by making glass cloth, aramid fiber, non-woven fabric, or the like impregnated with one of the above resins; and liquid crystal polymer (LCP), liquid crystal polyester, etc.

Next, a metal mask M is formed, through patterning, on the resin layer 10 except for the portion corresponding to the opening position of each of the vias V. More specifically, a metal film such as a copper film is deposited on the resin layer 10, and is subjected to conformal processing using photolithography and etching, thereby forming a pattern for the metal mask M which is opened at the position where the via V is formed. At this point, the opening size is preferably equal to or slightly wider than that of the external connection pad P.

Wet blasting using inorganic abrasive grains of, e.g., alumina is performed thereon to grind the portion of the resin layer 10, thereby forming the via V. Here, a grinding rate of the resin layer 10 is larger than that of the protective layer 24 (the resin layer 10 is easier to grind); in other words, the grinding rate of the protective layer 24 is smaller than that of the resin layer 10 (the protective layer 24 is more difficult to grind). Therefore, even if the formation of the via V progress such that the via V reaches the protective layer 24, with the grinding condition for the resin layer 10, the external connection pad P is exposed in the via V in the state where the protective layer 24 is not substantially ground. In other words, the state where the via V is formed on a part of the external connection pad P and on a part of the protective layer 24.

As described above, in the semiconductor embedded module 1, when grinding the resin layer 10 to form the via V on the external connection pad P for establishing an external connection for the semiconductor device 20, even if the position where the via V is formed is dislocated from the target position, the protective layer 24 is not ground. Therefore, the semiconductor device 20 is protected by the protective layer 24. As a result, the circuit and internal wiring of the semiconductor device 20 can be effectively prevented from being damaged due to grinding.

Figure 2:
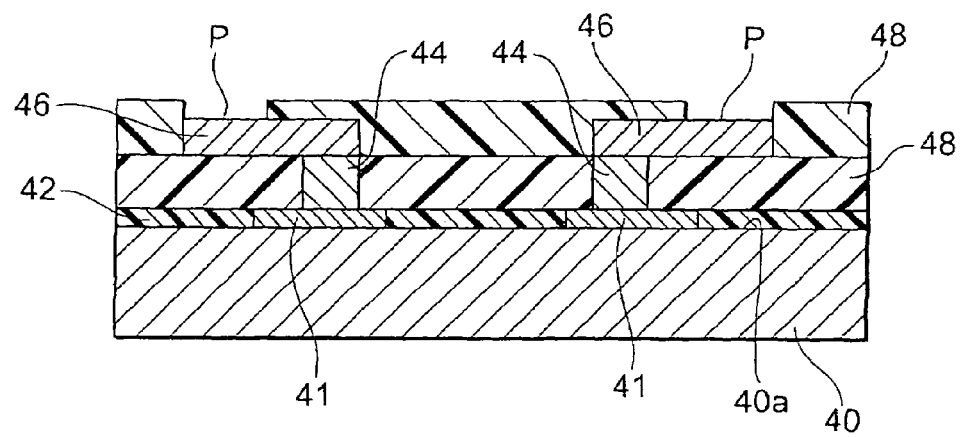
FIG. 2 is a sectional view showing another example of a semiconductor device embedded in a semiconductor embedded module according to the invention.
Figure 3:
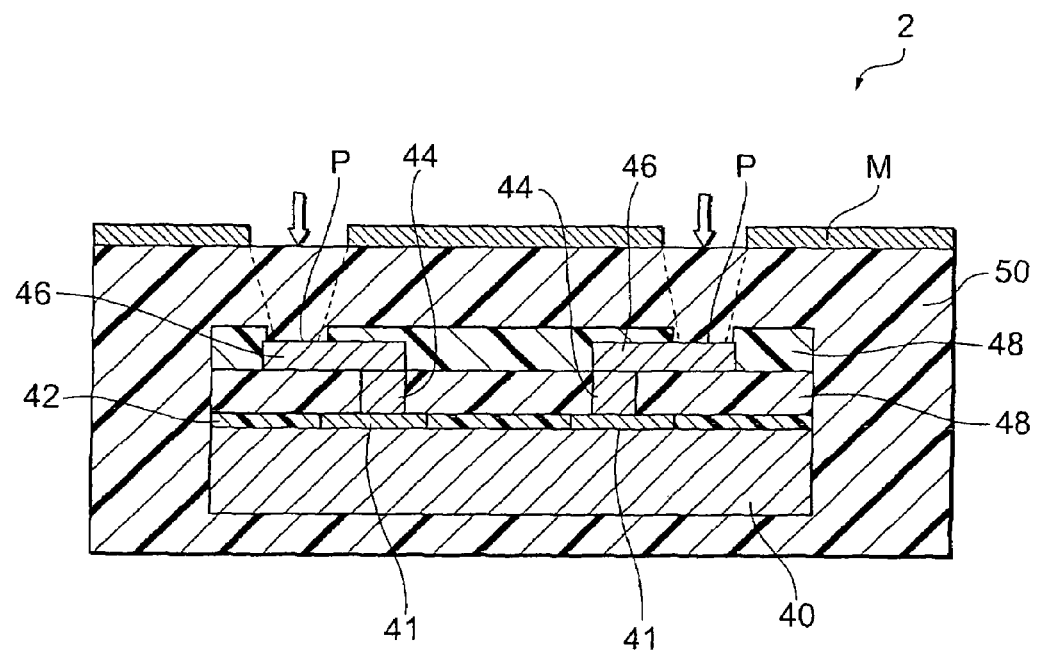
FIG. 3 is a sectional view showing an example of a semiconductor embedded module which embeds the semiconductor device shown in FIG. 2.

FIG. 2 is a sectional view showing another example of a semiconductor device embedded in a semiconductor embedded module according to the invention. FIG. 3 is a sectional view showing an example of a semiconductor embedded module which embeds the above semiconductor device.

A semiconductor device 40 has a configuration in which: a protective layer 42 (passivation film) is provided to a layer of wiring pads 41 formed on a main surface 40a; and a redistribution layer 46 (wiring layer) is connected to the wiring pads 41 through via conductors 44. The via conductors 44 and the redistribution layer 46 are embedded in a resin layer 48 (first insulating layer), and the resin layer 48 is provided with openings such that portions of the redistribution layer 46 which correspond to external connection pads P are exposed.

Furthermore, as shown in FIG. 3, a semiconductor embedded module 2 has a configuration in which the semiconductor device in the state shown in FIG. 2 is embedded in a resin layer 50 (second insulating layer). The resin layer 50 is formed of a material having a grinding rate larger than that of the resin layer 48. This figure shows the state in which the metal mask M having openings is formed on the resin layer 50. Blasting treatment is performed using the metal mask M to grind portions of the resin layer which are located below the openings, thereby forming vias. As a result, the external connection pads P of the redistribution layer 46 are exposed.

Figure 4:
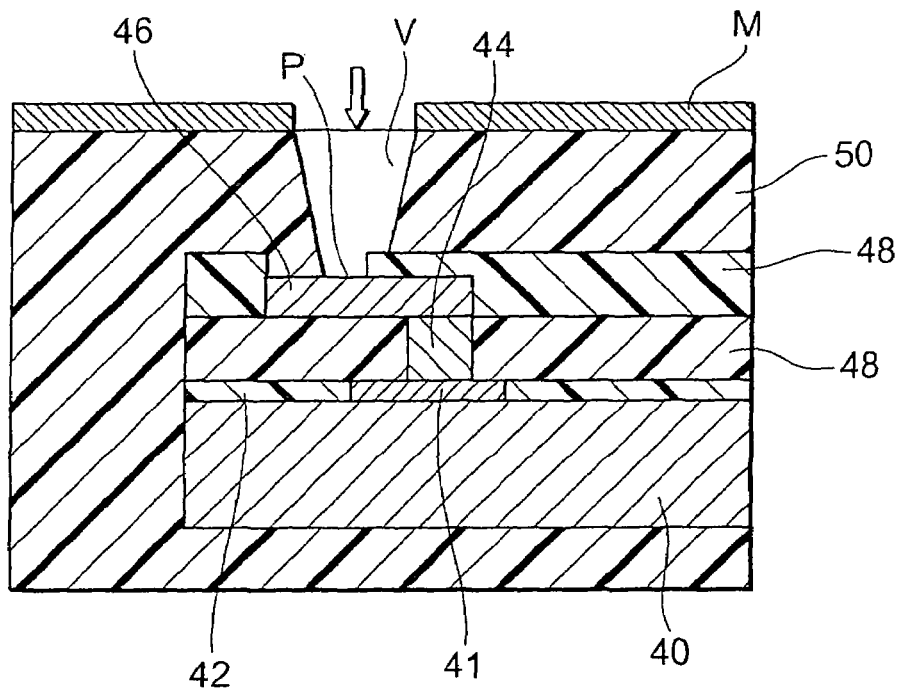
FIG. 4 is a partially sectional view showing an example of the case where, in a semiconductor embedded module 2, blasting treatment is performed using a mask pattern of a metal mask M which is formed with an opening size different from that of the metal mask M shown in FIG. 5.
Figure 5:
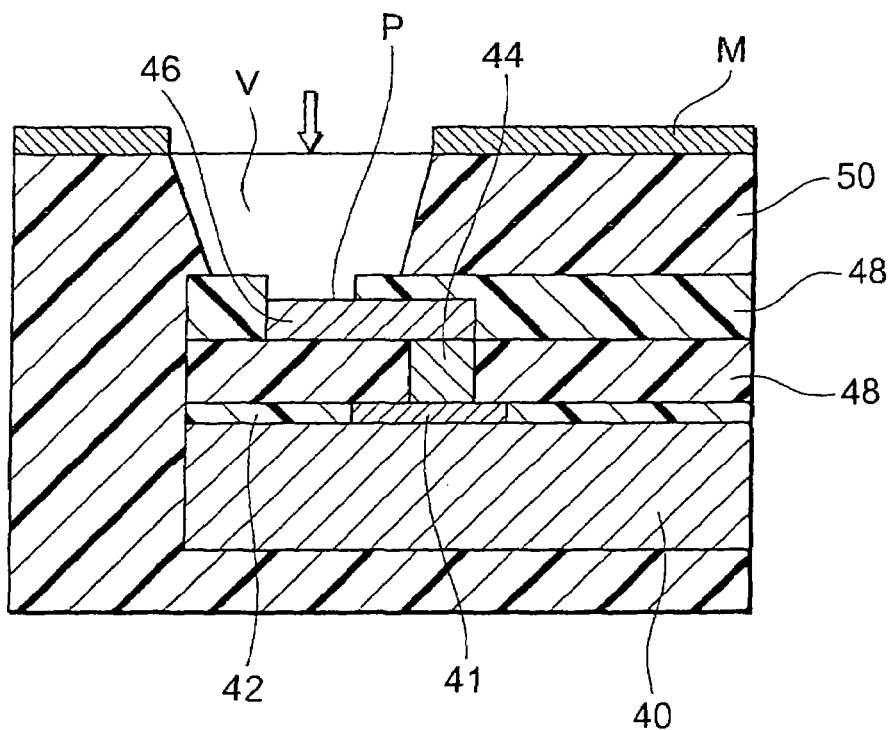
FIG. 5 is a partially sectional view showing an example of the case where, in the semiconductor embedded module 2, blasting treatment is performed using a mask pattern of a metal mask M which is formed with an opening size different from that of the metal mask M shown in FIG. 4.

Here, FIGS. 4 and 5 are partially sectional views respectively showing examples in the case where, in the semiconductor embedded module 2, mask patterns for a metal mask M which differ in opening size from each other are formed, and then blasting treatment is performed. FIG. 4 shows that, in the case where the opening of the metal mask M has substantially the same size as the external connection pad P of the redistribution layer 46, the above opening is formed at a position slightly dislocated from the position of the external connection pad P. In this case, when blasting treatment progresses, the via V reaches the resin layer 48 because the opening position for the metal mask M is dislocated. However, the resin layer 48 has a grinding rate smaller than that of the resin layer 50, and therefore is not substantially ground with the same blasting treatment condition as for the resin layer 50. As a result, the redistribution layer 46 below the resin layer 48 and the semiconductor device 40 are protected by the resin layer 48.

Meanwhile, FIG. 5 shows that, in the case where the opening of the metal mask M has a size larger than that of the external connection pad P of the redistribution layer 46, the above opening is formed at the position that encompasses the position of the external connection pad P. In this case, when blasting treatment progresses, the via V reaches the resin layer 48 because the opening size for the metal mask M is larger. However, as with the case shown in FIG. 4, the resin layer 48 has a grinding rate smaller than that of the resin layer 50, and therefore is not substantially ground with the same blasting treatment condition as for the resin layer 50. As a result, the redistribution layer 46 below the resin layer 48 and the semiconductor device 40 are protected by the resin layer 48.

As described above, the present invention is not limited to the above embodiment, and various modifications of the invention can be made as long as the gist of the invention is not changed. For example, the semiconductor embedded modules 1 and 2 each may be provided with plural semiconductor devices, and may be provided with electronic components other than semiconductor devices. Also, for the formation of the via V, dry blasting may be performed instead of wet blasting. However, from the viewpoint of effective prevention of electrification, wet blasting is preferably performed. Also, for the formation of the via V, for example, etching, other mechanical processing, and laser processing may be employed in addition to blasting treatment. If mechanical processing or laser processing is employed, desmear treatment may be performed after the formation of the via V. Moreover, the metal mask M (conformal mask) for forming the via V may not be formed. In this case, the via V can be opened without the metal mask M if a blast (flow) size of a blast material to be ejected can conform to the size of the via V. Here, other treatment may also be employed instead of blasting treatment. In addition, the difference in grinding rate between the first insulating layer and the second insulating layer is not particularly limited as long as the difference is to the extent that the second insulating layer is not substantially ground with the same blasting treatment condition as for the first insulating layer.

As described above, according to the semiconductor embedded module and the method for producing the same of the present invention, the circuit and internal wiring of the semiconductor device can be reliably prevented from being damaged due to grinding. Accordingly, the semiconductor embedded module and the relevant producing method can be widely and effectively used for equipment, apparatuses, systems, various devices, etc., particularly those which require a reduction in size and higher performance, each of which embeds a semiconductor device.

What is claimed is:
1. A semiconductor embedded module, comprising:
    a semiconductor device which is provided with or connected with a wiring layer;
    a first insulating layer (1) which is formed of imide resin or a resin composition containing imide resin and (2) which is provided in the periphery of the wiring layer such that an external connection pad of the wiring layer is exposed;
    a second insulating layer (1) which is formed of epoxy resin or a resin composition containing epoxy resin, (2) which is directly laminated on a first surface of the first insulating layer opposite to a second surface of the first insulating layer provided on the wiring layer, and (3) which has a grinding rate in a blasting treatment larger than that of the first insulating layer; and
    a via which is opened onto at least a part of the external connection pad and at least a part of the second insulating layer.
2. The semiconductor embedded module according to claim 1, wherein the via is formed in the second insulation layer, wherein the external connection pad is exposed inside of the via.
3. The semiconductor embedded module according to claim 1, wherein the second insulating layer covers a majority of the first surface of the first insulating layer.
4. The semiconductor embedded module according to claim 1, wherein the via is formed by the second insulating layer laminated on the first insulating layer.
5. A method for producing a semiconductor embedded module, the method comprising the steps of:
    preparing a semiconductor device which is provided with a wiring layer;
    providing a first insulating layer formed of imide resin or a resin composition containing imide resin in the periphery of the wiring layer such that an external connection pad of the wiring layer is exposed;
    providing, on a first surface of the first insulating layer opposite to a second surface of the first insulating layer provided on the wiring layer, a second insulating layer that is formed of epoxy resin or a resin composition containing epoxy resin and that has a grinding rate in a blasting treatment larger than that of the first insulating layer; and
    grinding a part of the second insulating layer which is on the external connection pad to form a via to have the external connection pad exposed.

6. The method for producing a semiconductor embedded module according to claim 5, comprising a step of providing a mask which is provided with an opening corresponding to a portion of the second insulating layer which is above the external connection pad,
    wherein in the step of having the external connection pad exposed, the second insulating layer is ground through blasting treatment to form the via.

7. The method for producing a semiconductor embedded module according to claim 6, wherein wet blasting is employed as the blasting treatment.

\* \* \* \* \*